US012456694B2

(12) United States Patent
Oh et al.

(10) Patent No.: US 12,456,694 B2
(45) Date of Patent: Oct. 28, 2025

(54) SEMICONDUCTOR DEVICE HAVING STACKED MEMORY CELL ARRAY, PERIPHERAL CIRCUIT AND SHIELDING MEMBER

(71) Applicant: SK hynix Inc., Icheon-si (KR)

(72) Inventors: Sung Lae Oh, Icheon-si (KR); Hyun Soo Shin, Icheon-si (KR); Seung Pil Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 650 days.

(21) Appl. No.: 17/876,722

(22) Filed: Jul. 29, 2022

(65) Prior Publication Data

US 2023/0282598 A1 Sep. 7, 2023

(30) Foreign Application Priority Data

Mar. 3, 2022 (KR) .................. 10-2022-0027351

(51) Int. Cl.
*H01L 23/552* (2006.01)
*H01L 23/00* (2006.01)
*H01L 25/065* (2023.01)
*H01L 25/18* (2023.01)

(52) U.S. Cl.
CPC ............ *H01L 23/552* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/1434* (2013.01); *H01L 2924/3025* (2013.01)

(58) Field of Classification Search
CPC ....... H01L 2224/08145; H01L 25/0657; H01L 2924/1431; H01L 2924/1434; H01L 23/5225; H01L 23/552; H01L 2924/3025; H01L 2225/06537; H01L 24/08; H01L 25/18
USPC ......................................................... 257/659
See application file for complete search history.

(56) References Cited

U.S. PATENT DOCUMENTS

| | | | | |
|---|---|---|---|---|
| 2020/0006371 A1* | 1/2020 | Huo | ................ | H10B 43/40 |
| 2021/0057427 A1* | 2/2021 | Oh | ................ | H10B 43/27 |
| 2021/0065751 A1* | 3/2021 | Park | ................ | G11C 7/18 |
| 2021/0066280 A1* | 3/2021 | Park | ................ | H01L 24/08 |
| 2022/0085003 A1* | 3/2022 | Iwashita | ............ | H01L 25/0657 |

FOREIGN PATENT DOCUMENTS

KR 10-2018-0097852 A 9/2018

* cited by examiner

*Primary Examiner* — Didarul A Mazumder

(57) ABSTRACT

A semiconductor device includes a first semiconductor chip including a memory cell array and a plurality of bit lines; a second semiconductor chip including a peripheral circuit, and bonded to the first semiconductor chip; and a shielding member including a link pattern that is configured in a bonding metal layer of any one of the first semiconductor chip and the second semiconductor chip, and has a grid shape or stripe shapes, and a plurality of island patterns that are configured in a bonding metal layer of the other one of the first semiconductor chip and the second semiconductor chip, and bonded to the link pattern.

14 Claims, 17 Drawing Sheets

SEMICONDUCTOR DEVICE HAVING STACKED MEMORY CELL ARRAY, PERIPHERAL CIRCUIT AND SHIELDING MEMBER

CROSS-REFERENCE TO RELATED APPLICATION

The present application claims priority under 35 U.S.C. § 119(a) to Korean Patent Application No. 10-2022-0027351 filed in the Korean Intellectual Property Office on Mar. 3, 2022, which is incorporated herein by reference in its entirety.

BACKGROUND

1. Technical Field

Various embodiments generally relate to a semiconductor technology, and more particularly, to a semiconductor device having a shielding member.

2. Related Art

POC (peripheral over cell) structures have been proposed as measures for increasing the degree of integration in semiconductor devices. In a POC (peripheral over cell) structure, a memory cell array and a peripheral circuit for controlling the memory cell array are separately manufactured on different semiconductor chips, and then the semiconductor chips are bonded to each other to couple the memory cell array and the peripheral circuit.

SUMMARY

Various embodiments are directed to providing a semiconductor device having a shielding member.

In an embodiment, a semiconductor device may include: a first semiconductor chip including a memory cell array and a plurality of bit lines; a second semiconductor chip, including a peripheral circuit and bonded to the first semiconductor chip; and a shielding member including a link pattern disposed in a bonding metal layer of any one of the first semiconductor chip and the second semiconductor chip, and has a grid shape or stripe shapes, and a plurality of island patterns disposed in a bonding metal layer of the other one of the first semiconductor chip and the second semiconductor chip, and bonded to the link pattern.

In an embodiment, a semiconductor device may include: a first semiconductor chip; a second semiconductor chip bonded to the first semiconductor chip; and a shielding member including a link pattern configured in a bonding metal layer of any one of the first semiconductor chip and the second semiconductor chip, and has a grid shape or stripe shapes, and a plurality of island patterns configured in a bonding metal layer of the other one of the first semiconductor chip and the second semiconductor chip, and bonded to the link pattern.

DETAILED DESCRIPTION

Figure 1:
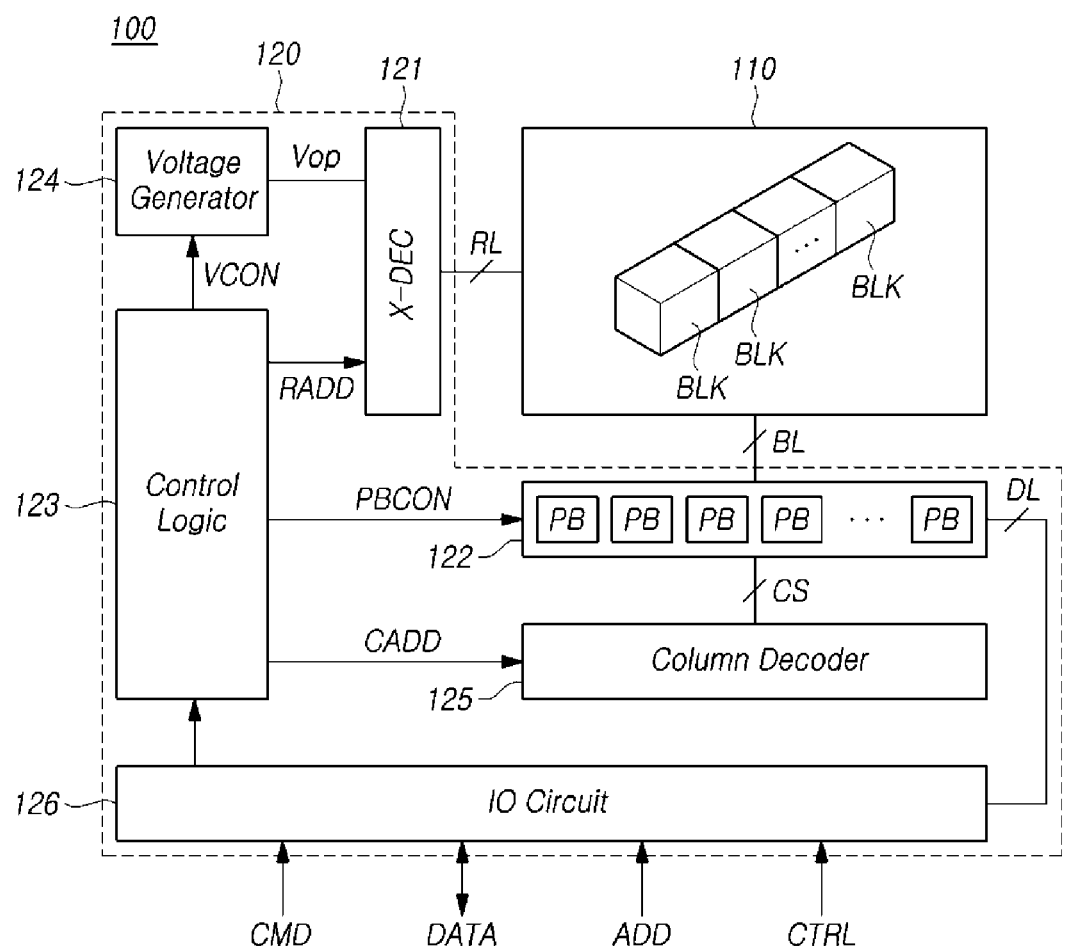
FIG. 1 is a block diagram illustrating a semiconductor device in accordance with an embodiment of the present disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g., "a," "an," "the"), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Various interactions and operations are technically possible. Various exemplary embodiments can be practiced individually or in combination.

Hereinafter, various examples of embodiments of the present disclosure will be described in detail with reference to the accompanying drawings.

FIG. 1 is a block diagram illustrating a semiconductor device in accordance with an embodiment of the present disclosure.

Referring to FIG. 1, a semiconductor device 100 may include a memory cell array 110 and a peripheral circuit 120. The peripheral circuit 120 may include a row decoder 121, a page buffer circuit 122 and other peripheral circuits. For example, other peripheral circuits may include a control logic 123, a voltage generator 124, a column decoder 125 and an input/output (I/O) circuit 126.

The memory cell array 110 may include a plurality of memory blocks BLK. Although not illustrated, each memory block BLK may include a plurality of pages. The memory block BLK may be a basic unit of an erase operation, and the page may be a basic unit of a read operation.

The memory cell array 110 may be coupled to the row decoder 121 through a plurality of row lines RL, and may be coupled to the page buffer circuit 122 through a plurality of bit lines BL. The row lines RL may include drain select lines, word lines and source select lines.

The memory cell array 110 may include a plurality of memory cells that are disposed in areas or regions where the plurality of bit lines BL and the plurality of word lines respectively intersect with each other. The memory cells may be volatile memory cells, which lose data stored therein when the power supply is cut off, or the memory cells may be nonvolatile memory cells, which retain data stored therein even after the power supply is cut off. For example, when the memory cells are volatile memory cells, the semiconductor device 100 may be a DRAM (dynamic random access memory), an SRAM (static random access memory), a mobile DRAM, a DDR SDRAM (double data rate synchronous dynamic random access memory), an LPDDR (low power DDR) SDRAM, a GDDR (graphic DDR) SDRAM or an RDRAM (Rambus dynamic random access memory). When the memory cells are nonvolatile memory cells, the semiconductor device 100 may be an EEPROM (electrically erasable programmable read-only memory), a flash memory, a PRAM (phase change random access memory), an RRAM (resistive random access memory), an NFGM (nano-floating gate memory), a PoRAM (polymer random access memory), an MRAM (magnetic random access memory) or an FRAM (ferroelectric random access memory). The semiconductor device 100 may be a hybrid memory, which includes both volatile memory cells and nonvolatile memory cells.

The memory cell may be a single level cell (SLC) that stores one-bit data or a multi-level cell (MLC) that stores two or more-bit data. The multi-level cell may store two-bit data, three-bit data, four-bit data, and so forth. The memory cell array 110 may include at least one single level cell and one multi-level cell.

The row decoder 121 may select a memory block BLK in response to a row address signal RADD from the control logic 123. The row decoder 121 may transfer an operating voltage Vop from the voltage generator 124, to the row lines RL of the selected memory block BLK.

The page buffer circuit 122 may include a plurality of page buffers PB, which are coupled to the plurality of bit lines BL. The page buffer circuit 122 may be coupled to the input/output circuit 126 through data lines DL. The page buffer circuit 122 may receive a page buffer control signal PBCON from the control logic 123, and may transmit and receive a data signal to and from the input/output circuit 126. The page buffer circuit 122 may control a bit line BL in response to the page buffer control signals PBCON. For example, the page buffer circuit 122 may detect data, stored in a memory cell of the memory cell array 110, by sensing the signal of a bit line BL of the memory cell array 110 in response to the page buffer control signal PBCON, and may transmit a data signal to the input/output circuit 126 according to the detected data. The page buffer circuit 122 may apply a signal to a bit line BL on the basis of a data signal received from the input/output circuit 126 and in response to the page buffer control signal PBCON, and accordingly, may write data in a memory cell of the memory cell array 110. The page buffer circuit 122 may write data to or read data from memory cells that are coupled to an activated word line.

The control logic 123 may output a voltage control signal VCON and the page buffer control signal PBCON in response to a command signal CMD inputted through the input/output circuit 126. The control logic 123 may output the row address signal RADD and a column address signal CADD in response to an address signal ADD inputted through the input/output circuit 126.

The voltage generator 124 may generate various voltages required in the semiconductor device 100, including the operating voltage Vop provided to the row lines RL, in response to the voltage control signal VCON from the control logic 123. For example, the voltage generator 124 may be configured to generate various levels of program voltages, pass voltages, read voltages and erase voltages in response to the voltage control signal VCON.

The column decoder 125 may generate a column select signal CS in response to the column address signal CADD received from the control logic 123. For example, the column decoder 125 may generate the column select signal CS corresponding to the column address signal CADD such that some data selected by the column address signal CADD, from among data of the page buffers PB, may be transferred to the input/output circuit 126.

The input/output circuit 126 may receive the command signal CMD, the address signal ADD and a control signal CTRL from outside the semiconductor device 100, and may transmit and receive data DATA to and from a device outside of the semiconductor device 100, such as a memory controller.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. The first direction FD may correspond to the extending direction of bit lines or the arrangement direction of row lines, and the second direction SD may correspond to the arrangement direction of the bit lines or the extending direction of the row lines. The first direction FD and the second direction SD may substantially perpendicularly intersect with each other. In the drawings, a direction indicated by an arrow and a direction opposite thereto represent the same direction.

Figure 2:
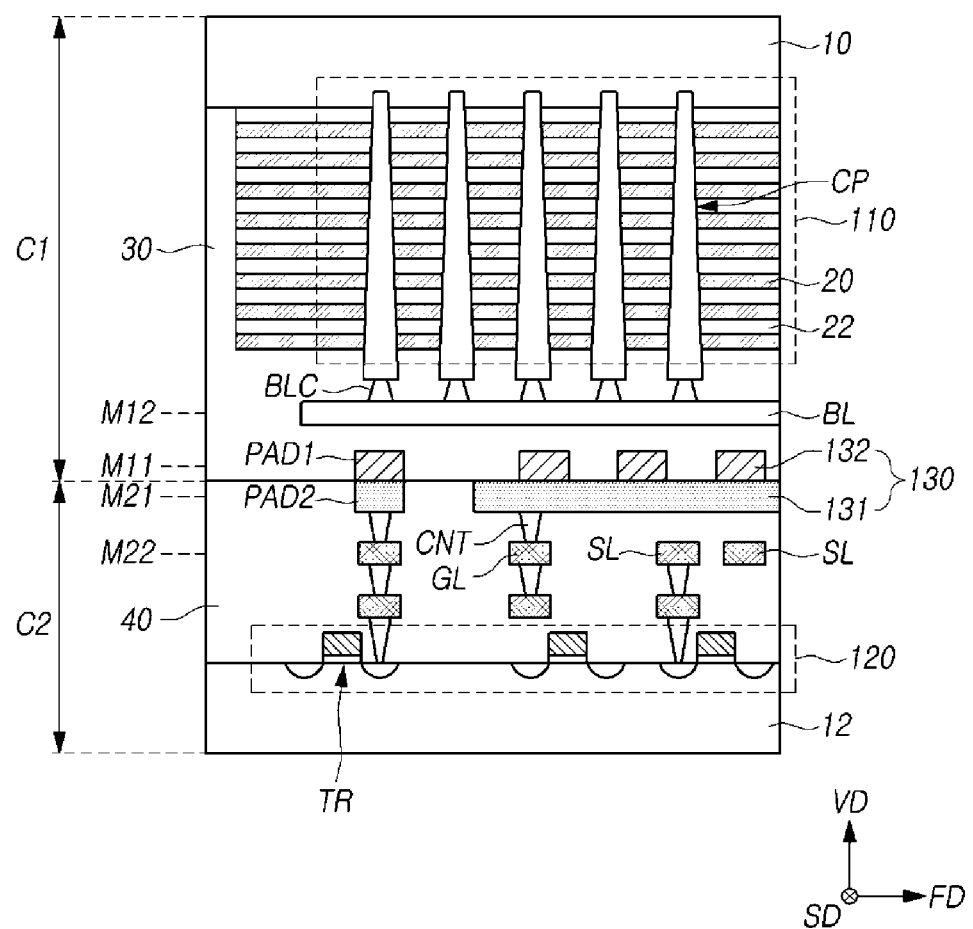
FIG. 2 is a cross-sectional view illustrating a semiconductor device in accordance with an embodiment of the present disclosure.

FIG. 2 is a cross-sectional view illustrating a semiconductor device in accordance with an embodiment of the present disclosure.

Referring to FIG. 2, a semiconductor device may include a first semiconductor chip C1; a second semiconductor chip C2 bonded to the first semiconductor chip C1; and a shielding member 130. The shielding member 130 may include a link pattern 131 configured in a bonding metal layer M21 of the second semiconductor chip C2 and a plurality of island patterns 132 configured in a bonding metal layer M11 of the first semiconductor chip C1. The plurality of island patterns 132 may be bonded to the link pattern 131.

The first semiconductor chip C1 may be oriented so that the bonding metal layer M11 is bonded to the bonding metal layer M21 of the second semiconductor chip C2. In an embodiment, the first semiconductor chip C1 and the second semiconductor chip C2 may be bonded to each other at a wafer level. In another embodiment, the first semiconductor chip C1 and the second semiconductor chip C2 may be bonded to each other at a chip level.

The first semiconductor chip C1 may include a first substrate 10 and a memory cell array 110 that is defined on the first substrate 10. The memory cell array 110 may include a plurality of electrode layers 20 and a plurality of interlayer dielectric layers 22, which are alternately stacked on the first substrate 10. The memory cell array 110 may also include a plurality of cell plugs CP that pass through the plurality of electrode layers 20 and the plurality of interlayer dielectric layers 22.

The electrode layers 20 may configure row lines. The row lines may include at least one source select line, a plurality of word lines and at least one drain select line. The drain select line and the source select line may be disposed on and disposed under, respectively, the plurality of word lines.

The cell plugs CP may pass through the plurality of electrode layers 20 and the plurality of interlayer dielectric layers 22 in the vertical direction VD to extend to the first substrate 10. Although not illustrated in detail, the cell plugs CP may each include a data storage layer and a channel layer. The channel layer of a cell plug CP may be coupled to a bit line BL through a bit line contact BLC.

A source select transistor may be configured in areas or regions where the source select line surrounds the cell plug CP. Memory cells may be configured in areas or regions where the word lines surround the cell plug CP. A drain select transistor may be configured in areas or regions where the drain select line surrounds the cell plug CP. The source select transistor, the memory cells and the drain select transistor disposed along one cell plug CP may configure one cell string.

Although FIG. 2 illustrates an example in which the memory cell array 110 is a three-dimensionally stacked memory, the scope of the present disclosure is not limited thereto. The memory cell array 110 may be a two-dimensional memory in which memory cells are disposed in a planar manner, for example, on a single plane.

In the first semiconductor chip C1, an inner metal layer M12 and the bonding metal layer M11 may be sequentially stacked on the memory cell array 110. A bit line BL may be configured in the inner metal layer M12. FIG. 2 is a cross-sectional view taken in the first direction FD, which is the extending direction of the bit line BL. Although FIG. 2 illustrates only one bit line BL, it is to be understood that a plurality of bit lines BL are arranged in the second direction SD within the inner metal layer M12.

A first bonding pad PAD1 may be configured in the bonding metal layer M11 of the first semiconductor chip C1. Although FIG. 2 illustrates only one first bonding pad PAD1 coupled to one bit line BL, it is to be understood that a plurality of first bonding pads PAD1 are configured in the bonding metal layer M11. For example, some of the plurality of first bonding pads PAD1 are respectively coupled to the plurality of bit lines BL, and other some of the plurality of first bonding pads PAD1 are coupled respectively to the plurality of electrode layers 20.

A dielectric layer 30 may be configured on the first substrate 10 to cover the memory cell array 110 and the inner metal layer M12 and to expose the top surface of the bonding metal layer M11. The dielectric layer 30 may have, for example, a multi-layered structure in which a plurality of dielectric materials are stacked. The top surface of the dielectric layer 30, which contacts the second semiconductor chip C2, may be configured by oxide.

The second semiconductor chip C2 may include a second substrate 12 and a peripheral circuit 120 that is defined on the second substrate 12. The peripheral circuit 120 may include a row decoder, a page buffer circuit and other peripheral circuits as described above with reference to FIG. 1. Other peripheral circuits may include a control logic, a voltage generator, a column decoder and an input/output circuit.

An inner metal layer M22 and the bonding metal layer M21 may be sequentially stacked on the peripheral circuit 120. A plurality of signal lines SL and a ground line GL may be configured in the inner metal layer M22. The signal lines SL, which serve to transfer signals necessary for the operation of the semiconductor device, may be electrically isolated from the shielding member 130. Some signal lines SL may be configured to overlap with the shielding member 130 in the vertical direction VD.

A second bonding pad PAD2 may be configured in the bonding metal layer M21. The second bonding pad PAD2 may be coupled to the peripheral circuit 120 through contacts and wiring lines. The first bonding pad PAD1 and the second bonding pad PAD2 may be bonded to each other to configure an electrical path that couples the memory cell array 110 of the first semiconductor chip C1 and the peripheral circuit 120 of the second semiconductor chip C2.

A dielectric layer 40 may be configured on the second substrate 12 to cover the peripheral circuit 120 and the inner metal layer M22 and to expose the top surface of the bonding metal layer M21. The dielectric layer 40 may have, for example, a multi-layered structure in which a plurality of dielectric materials are stacked. The top surface of the dielectric layer 40, which is in contact with the first semiconductor chip C1, may be configured by oxide.

The shielding member 130 may include the link pattern 131, which is configured in the bonding metal layer M21 of the second semiconductor chip C2, and the plurality of island patterns 132, which are configured in the bonding metal layer M11 of the first semiconductor chip C1 and are bonded to the link pattern 131. The plurality of island patterns 132 may be bonded in common to the link pattern 131, and may be electrically coupled to one another through the link pattern 131.

A ground voltage may be applied to the shielding member 130. For example, the link pattern 131 of the shielding member 130 may be coupled to the ground line GL through a contact CNT, and accordingly, the ground voltage of the ground line GL may be provided to the shielding member 130. As will be described later with reference to FIG. 10, the shielding member 130 may be disposed outside of a region used for disposing the bonding pads. Hereinafter, for the sake of convenience in explanation, a region in which the shielding member 130 is disposed will be defined as a shielding region.

In the shielding region, the shielding member 130 may shield the interference between the bit line BL and the signal lines SL to prevent the voltage of the bit line BL from changing due to the influence of the voltages loaded on the signal lines SL.

The first semiconductor chip C1 and the second semiconductor chip C2 may be bonded by hybrid bonding. Hybrid bonding includes oxide-to-oxide bonding and metal-to-metal bonding. When heat and pressure are applied in a state in which the first semiconductor chip C1 and the second semiconductor chip C2 are in contact, oxide-to-oxide bonding occurs, in which the oxide of the dielectric layer 30 of the first semiconductor chip C1 and the oxide of the dielectric layer 40 of the second semiconductor chip C2 are bonded to each other. After the oxide-to-oxide bonding has progressed to some extent, metal-to-metal bonding takes place, in which the bonding metal layer M11 of the first semiconductor chip C1 and the bonding metal layer M21 of the second semiconductor chip C2 are bonded to each other.

In the hybrid bonding, the percentage of the oxide-to-oxide bonding is directly associated with bonding reliability. If the percentage of the oxide-to-oxide bonding is low, a failure may occur in which a gap is formed between the first semiconductor chip C1 and the second semiconductor chip C2, and the first bonding pad PAD1 and the second bonding pad PAD2 are not coupled. To ensure reliable bonding, the percentage of the oxide-to-oxide bonding should be equal to or greater than a predetermined reference value.

Configuring the shielding member 130 in the bonding metal layers M11 and M21 is advantageous because it is not necessary to form a separate additional metal layer for the shielding member 130. However, due to the presence of the shielding member 130, the percentage of the oxide-to-oxide bonding may decrease, resulting in lower bonding reliability.

Embodiments of the present disclosure include a method configuring a shielding member in bonding metal layers without deteriorating bonding reliability.

Figure 3:
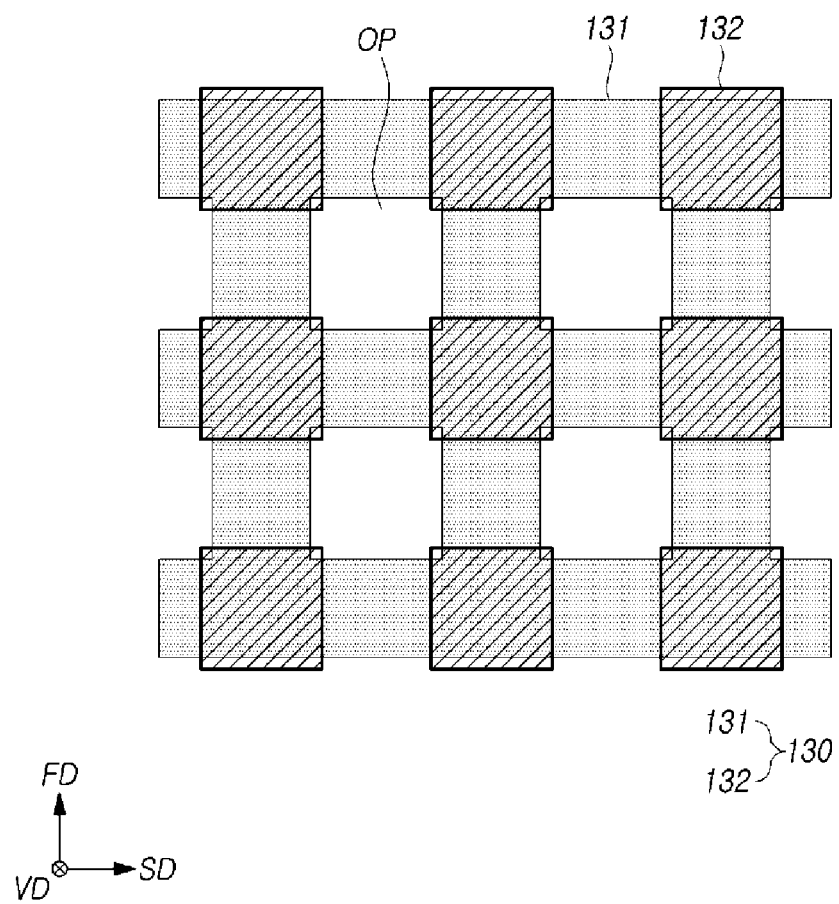
FIGS. 3 and 4 are top views illustrating shielding members in accordance with embodiments of the present disclosure.
Figure 4:
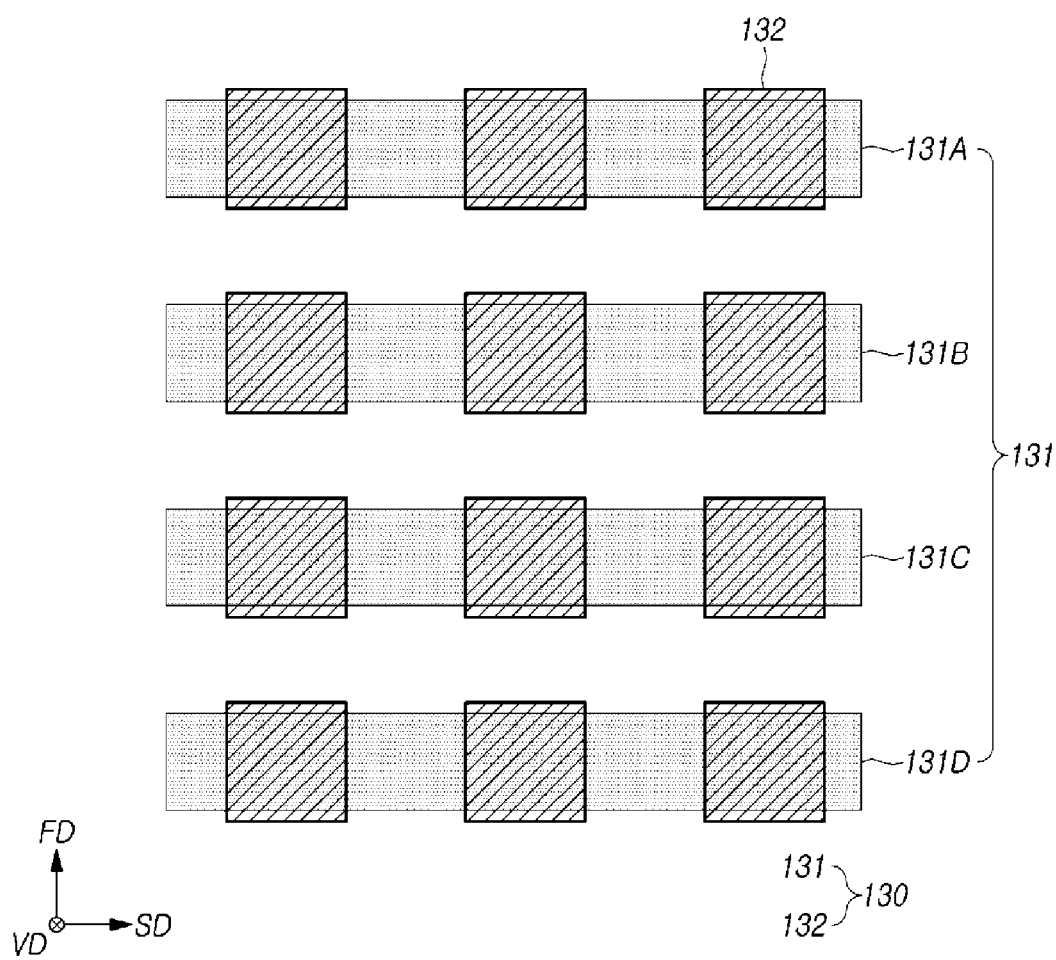
Figure 5:
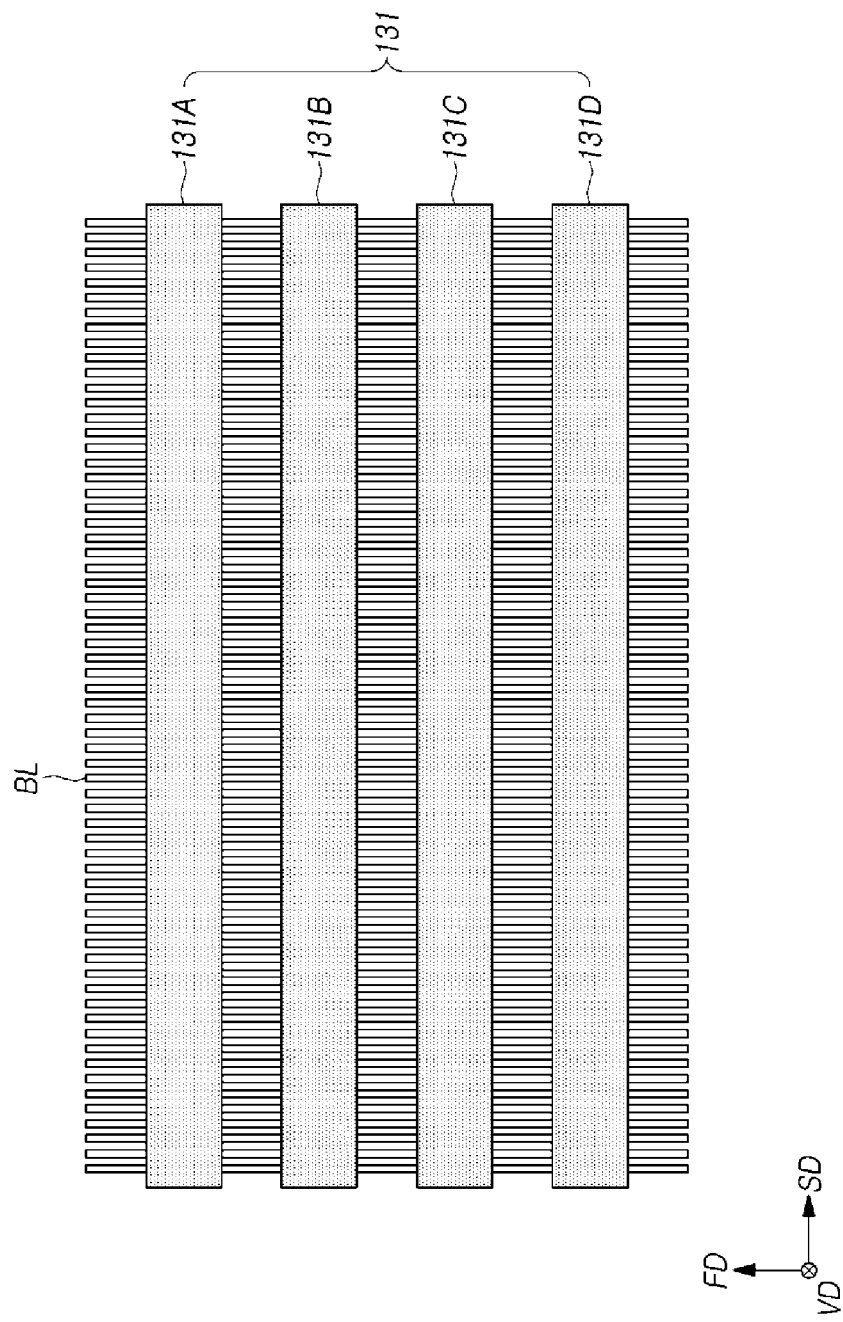
FIG. 5 is a top view illustrating a link pattern of FIG. 4 together with bit lines.

FIGS. 3 and 4 are top views illustrating shielding members in accordance with embodiments of the present disclosure, and FIG. 5 is a top view illustrating a link pattern of FIG. 4 together with bit lines.

Referring to FIG. 3, in an embodiment, a link pattern 131 and island patterns 132 of a shielding member 130 are disposed in a shielding region. The plurality of island patterns 132 may be two-dimensionally arranged to be spaced apart from one another. For example, the island patterns 132 may be arranged in the form of a matrix, forming a plurality of rows arranged in the first direction FD and a plurality of columns arranged in the second direction SD.

The link pattern 131 may have a planar structure in the form of a grid. For example, the link pattern 131 may include a plurality of first lines (column lines) extending in the first direction FD as a direction in which bit lines extend, and a plurality of second lines (row lines) extending in the second direction SD, which is a direction in which the bit lines are arranged. The plurality of second lines intersect with the plurality of first lines. The island patterns 132 may be bonded to the link pattern 131 at intersections, respectively, where the first lines and the second lines intersect with each other. The link pattern 131 may be configured such that the intersections of the lines, or the vertices of the grid, configuring the link pattern 131 match the matrix configuration of the island patterns 132. The grid-shaped link pattern 131 may include a plurality of openings OP. Oxide-to-oxide bonding occurs in areas where the link pattern 131 and/or the island patterns 132 are not disposed. The oxide-to-oxide bonding, in the form of isolated islands corresponding to the plurality of openings OP, is distributed over the entire shielding region.

Referring to FIGS. 4 and 5, in another embodiment, a link pattern 131 may have line or stripe shapes, including for example a plurality of lines 131A to 131D that are parallel to one another and arranged at regular intervals. For example, the plurality of lines 131A to 131D may extend in the second direction SD, the direction in which bit lines BL are arranged, and may be arranged in the first direction FD, the direction in which the bit lines BL extend. At least two island patterns 132 may be bonded to each of the lines 131A to 131D of the link pattern 131. Oxide-to-oxide bonding may occur between the lines 131A to 131D of the link pattern 131. The oxide-to-oxide bonding in the form of stripes or rows are distributed over an entire shielding region.

Figure 6:
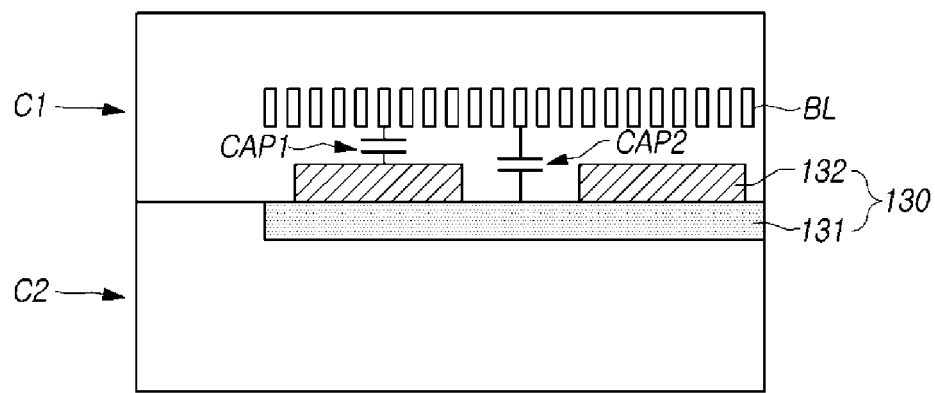
FIG. 6 is a diagram illustrating coupling capacitances between the shielding member and the bit lines of the semiconductor device in accordance with an embodiment of the present disclosure.
Figure 7:
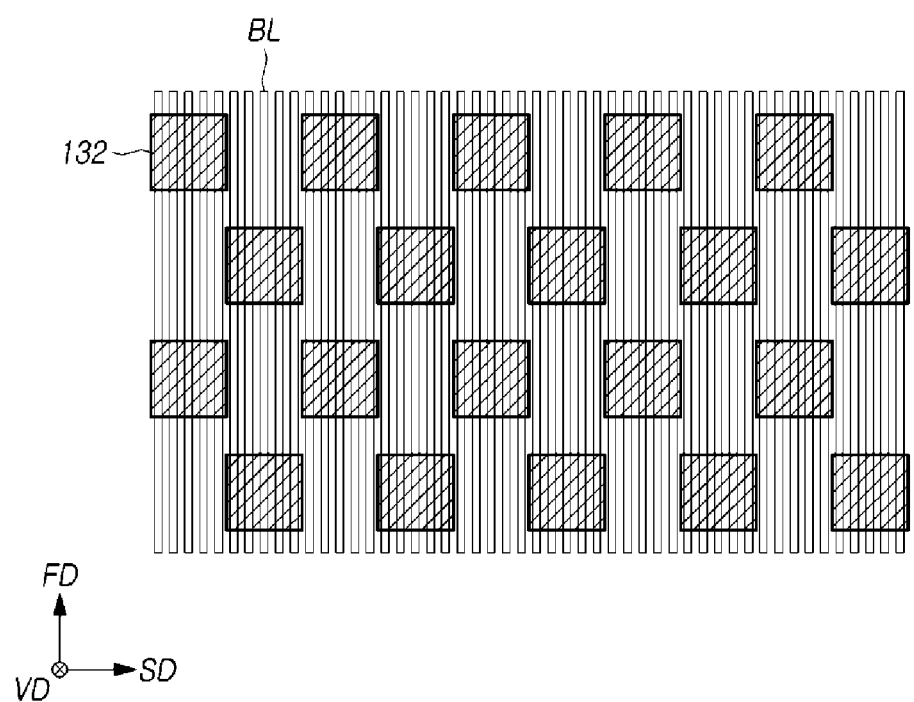
FIG. 7 is a top view illustrating an example of island patterns of a semiconductor device together with bit lines in accordance with an embodiment of the present disclosure.

FIG. 6 is a diagram illustrating coupling capacitances between the shielding member and the bit lines of the semiconductor device in accordance with an embodiment of the present disclosure, and FIG. 7 is a top view illustrating an example of island patterns of a semiconductor device together with bit lines in accordance with an embodiment of the present disclosure.

Referring to FIG. 6, a coupling capacitance is generated at a portion of the first semiconductor chip C1 in areas where a bit line BL and the shielding member 130 overlap with each other in the vertical direction VD. As is generally known in the art, a coupling capacitance is inversely proportional to the spacing between electrodes. The spacing between the shielding member 130 and the bit line BL changes depending on the presence or absence of the island patterns 132. The spacing between the shielding member 130 and the bit line BL is smaller in a portion where the island pattern 132 is present, and the spacing between the shielding member 130 and the bit line BL is larger in a portion where the island pattern 132 is absent. Accordingly, a coupling capacitance value CAP1 in the portion where the island pattern 132 is present is greater than a coupling capacitance value CAP2 in the portion where the island pattern 132 is absent. Thus, from a top view, a bit line BL has a coupling capacitance value that increases or decreases in proportion to the number of island patterns 132, counted in the column direction, that vertically overlap the bit line.

If the number of island patterns 132 that overlap a bit line BL varies across the plurality of bit lines BL, then deviations in coupling capacitance may occur as between bit lines BL, and accordingly, undesirable changes in the distribution of memory cells coupled to the bit lines BL may also increase.

Referring to FIG. 7, rows of island patterns 132 are arranged in the first direction FD. Odd-numbered rows and even-numbered rows of island patterns 132 may be offset from each other in the second direction SD, which is the row direction, such that the island patterns 132 of the odd-numbered rows overlap some bit lines BL in the vertical direction VD and the island patterns 132 of the even-numbered rows overlap the other remaining bit lines BL in the vertical direction VD. As a result, the island patterns 132 of the odd-numbered rows and the island patterns 132 of the even-numbered rows do not overlap the same bit lines BL in the vertical direction VD. In this embodiment, the number of island patterns 132 that overlap each bit line BL is constant, so deviations in coupling capacitance between bit lines BL may be reduced, which also decreases unwanted variation in cell distribution.

Figure 8:
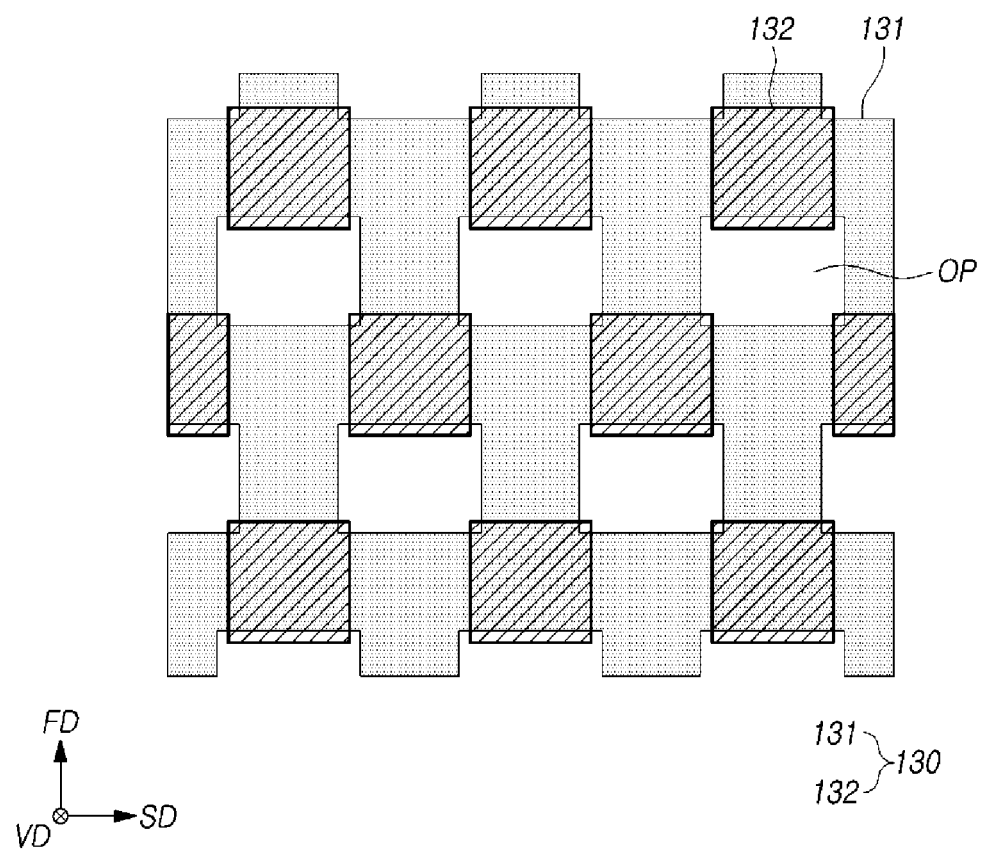
FIGS. 8 and 9 are top views of shielding members in accordance with embodiments of the present disclosure.
Figure 9:
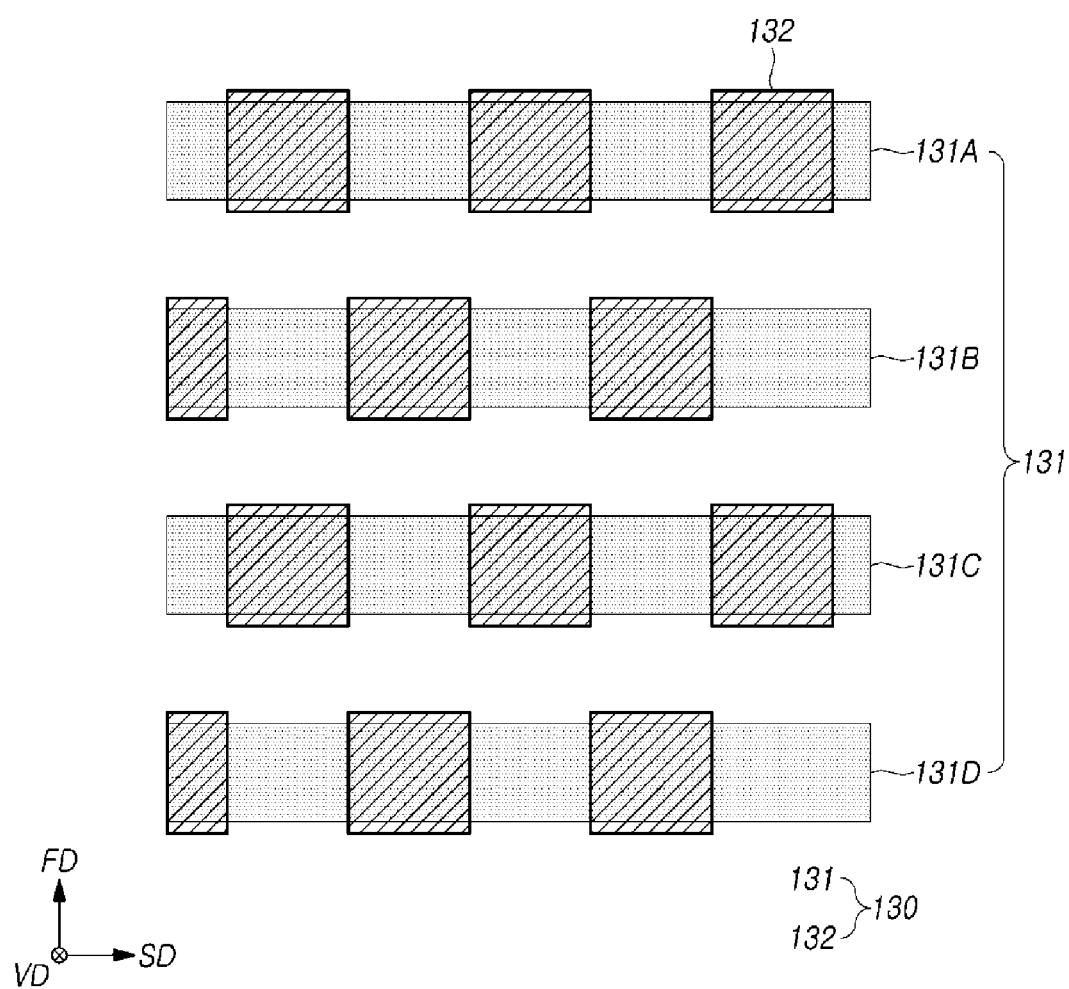

FIGS. 8 and 9 are top views of shielding members in accordance with embodiments of the present disclosure. Both FIGS. 8 and 9 illustrate shielding members in embodiments where island patterns of odd-numbered rows and island patterns of even-numbered rows are offset from each other in the row direction.

Referring to FIG. 8, a link pattern 131 may have a planar structure in the form of a grid. In order to ensure that intersections where first lines (column lines) of the link pattern 131 and second lines (row lines) of the link pattern 131 intersect with each other to match island patterns 132, the first lines of the link pattern 131 may be configured as line segments that couple two adjacent second lines of the link pattern 131. The second lines of the link pattern 131 may be continuous.

The link pattern 131 includes a plurality of openings OP. The openings OP are disposed in a plurality of rows, and are configured such that openings OP of an odd-numbered row and openings OP of an even-numbered row are offset from each other in the row direction. Oxide-to-oxide bonding in the form of isolated islands corresponding to the plurality of openings OP is distributed over an entire shielding region.

Referring to FIG. 9, a link pattern 131 may have stripe or row shapes including a plurality of lines 131A to 131D that are disposed parallel to one another at regular intervals. For example, the lines 131A to 131D of the link pattern 131 may extend in the second direction SD as a direction in which bit lines BL are arranged, and may be arranged in the first direction FD as a direction in which the bit lines BL extend. A plurality of island patterns 132 may be bonded to each of the lines 131A to 131D of the link pattern 131. Oxide-to-oxide bonding is configured between the lines 131A to 131D of the link pattern 131. The oxide-to-oxide bonding in the form of stripes or rows between the plurality of lines 131A to 131D may be distributed over an entire shielding region.

Figure 10:
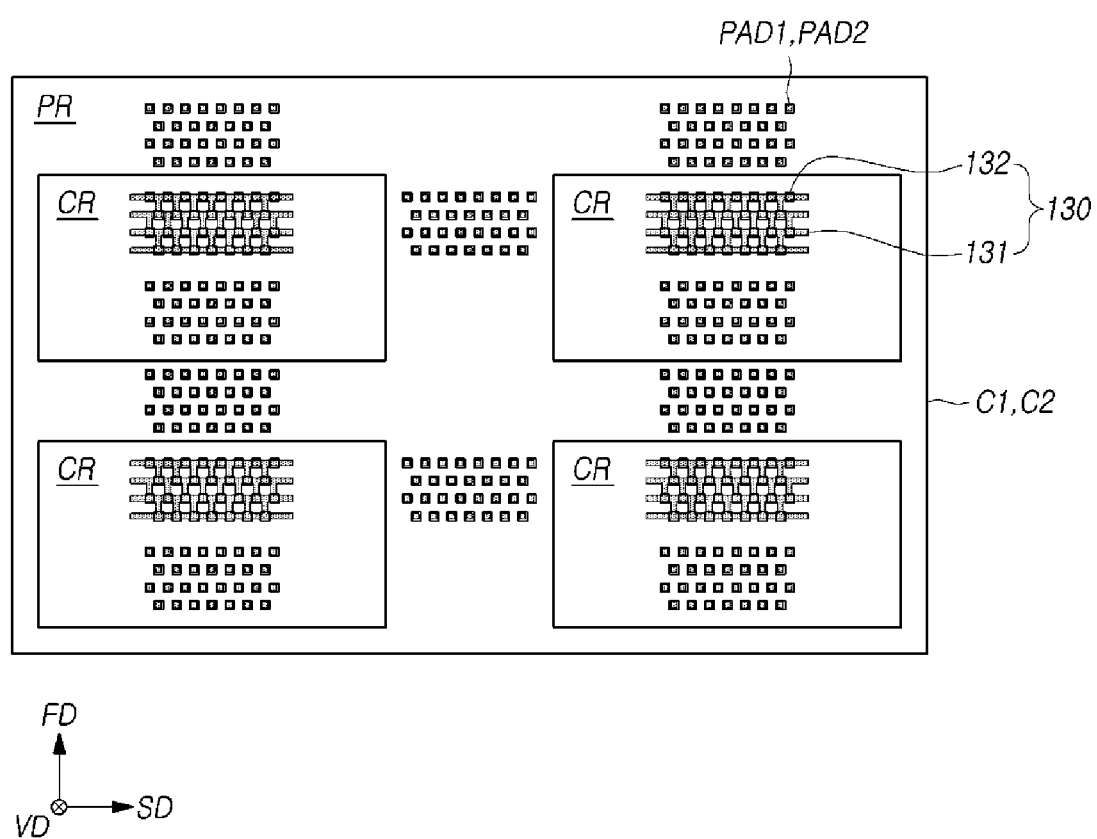
FIG. 10 is a top view illustrating regions where bonding pads and a shielding member are disposed in a semiconductor device in accordance with an embodiment of the present disclosure.

FIG. 10 is a top view illustrating regions where bonding pads and a shielding member are disposed in a semiconductor device in accordance with an embodiment of the present disclosure.

Referring to FIG. 10, a semiconductor device may include a plurality of cell regions CR and a peripheral region PR outside the cell regions CR. Although not illustrated, a memory cell array may be disposed in each of the cell regions CR of a first semiconductor chip C1. A page buffer circuit may be disposed in each of the cell regions CR of a second semiconductor chip C2. In the peripheral region PR of the second semiconductor chip C2, a row decoder may be disposed in a portion adjacent to the cell region CR in the second direction SD.

The semiconductor device may have a multi-plane structure including a plurality of planes. The first semiconductor chip C1 may include a plurality of memory cell arrays that are included in the plurality of planes, respectively, and the second semiconductor chip C2 may include a plurality of page buffer circuits that are included in the plurality of planes, respectively, as well as a plurality of row decoders that are included in the plurality of planes, respectively.

FIG. 10 illustrates a four-plane structure, with four cell regions CR disposed in the form of a 2×2 matrix. Although FIG. 10 illustrates a semiconductor device with a multi-plane structure, the semiconductor device may have a single-plane structure including only one plane.

First and second bonding pads PAD1 and PAD2 may be disposed in the cell regions CR and the peripheral region PR. The first and second bonding pads PAD1 and PAD2 that couple word lines and a row decoder may be disposed, in the peripheral region PR, in a portion adjacent to the cell region CR in the first direction FD.

The cell region CR may include a bonding region and a shielding region. The first and second bonding pads PAD1 and PAD2 that couple bit lines and a page buffer circuit may be disposed in the bonding region. The shielding region is a region that is not used for disposing the first and second bonding pads PAD1 and PAD2. A shielding member 130 may be disposed in the shielding region.

Figure 11:
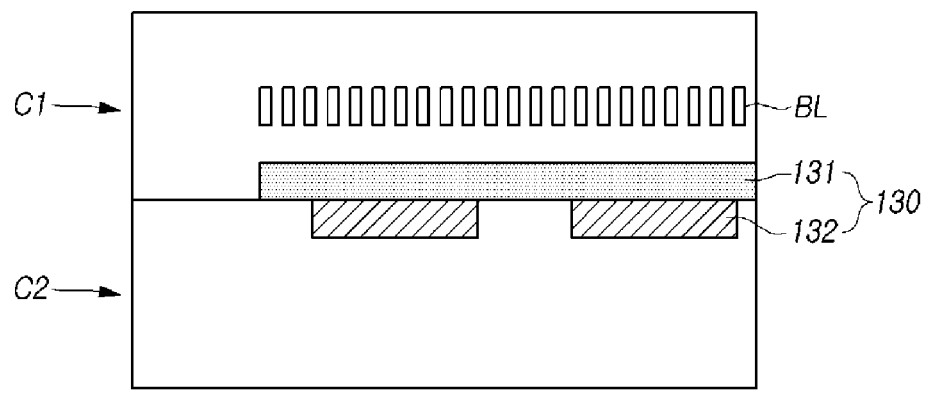
FIG. 11 is a schematic cross-sectional view of a semiconductor device in accordance with another embodiment of the present disclosure.

FIG. 11 is a schematic cross-sectional view of a semiconductor device in accordance with another embodiment of the present disclosure.

While FIGS. 2 to 10 illustrate a link pattern 131 of a shielding member 130 configured in the second semiconductor chip C2 and island patterns 132 of the shielding member 130 configured in the first semiconductor chip C1, the present disclosure is not limited thereto.

As illustrated in FIG. 11, the link pattern 131 of the shielding member 130 may be configured in the first semiconductor chip C1, and the island patterns 132 of the shielding member 130 may be configured in the second semiconductor chip C2.

Figure 12:
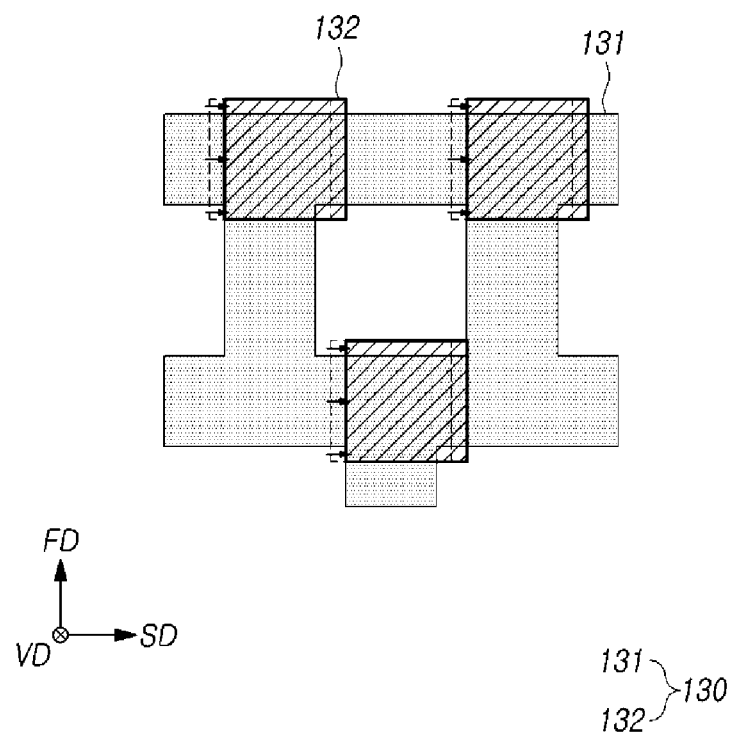
FIGS. 12 to 14 are top views illustrating cases in which pad shifts have occurred in a semiconductor device in accordance with the present disclosure.
Figure 13:
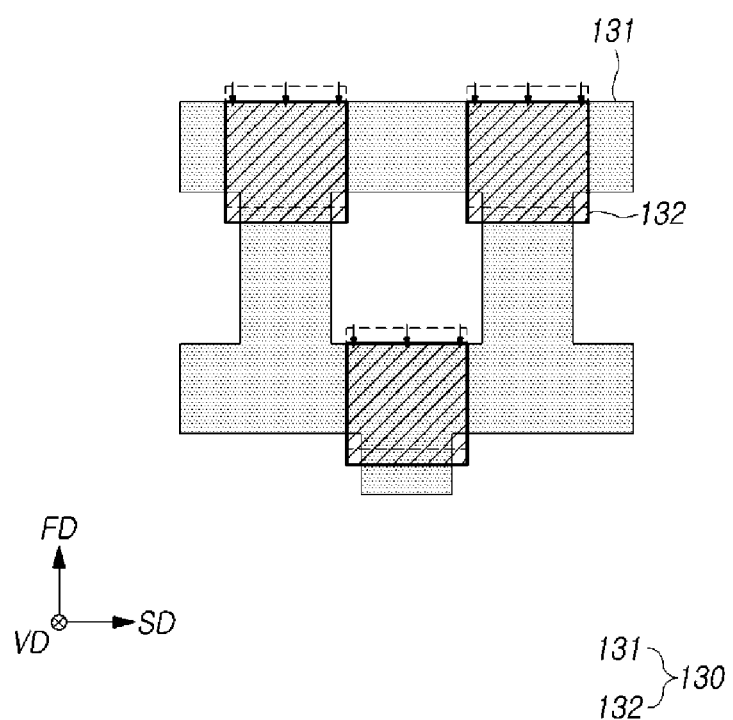
Figure 14:
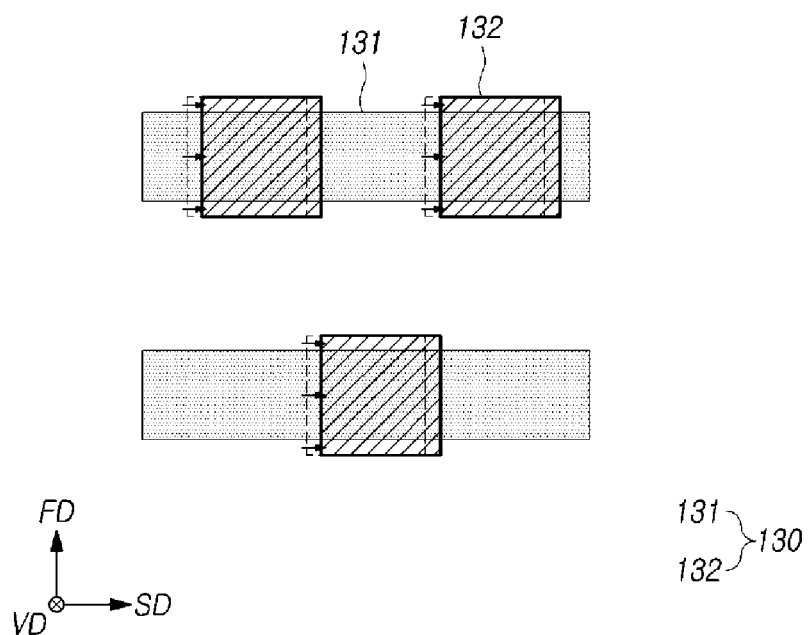

FIGS. 12 to 14 are top views illustrating cases in which pad shifts have occurred in a semiconductor device in accordance with the present disclosure.

As described above with reference to FIG. 2, the plurality of electrode layers 20, the plurality of interlayer dielectric layers 22 and the metal layers M11 and M12 are disposed on the first substrate 10 of the first semiconductor chip C1. These material layers have different stresses from the first substrate 10, and as a result, a stress imbalance between the material layers and the first substrate 10 may result. When a stress imbalance occurs, the first substrate 10 may be deformed or warped to reach an equilibrium stress. Such deformation or warpage may cause a difficulty in a subsequent process. For example, the first bonding pad PAD1 and the island patterns 132 of the first semiconductor chip C1 may be bonded in a state in which they are shifted, in a warpage direction, from predetermined positions.

FIGS. 12 and 14 illustrate cases in which the island patterns 132 are bonded in a state in which they are shifted in the second direction SD from predetermined positions (where predetermined portions are indicated by dotted lines), and FIG. 13 illustrates a case in which the island patterns 132 are bonded in a state in which they are shifted in the first direction FD from predetermined positions (where predetermined portions indicated by dotted lines).

Referring to FIGS. 12 and 13, the link pattern 131 is configured in a grid shape, and the island patterns 132 are configured to match intersections, respectively, where lines configuring the link pattern 131 intersect with each other. Thus, even though the island patterns 132 are bonded in a state in which they are shifted in the second direction SD or the first direction FD from the predetermined positions, the area of the oxide-to-oxide bonding does not decrease or the area decreased is immaterial.

Referring to FIG. 14, the link pattern 131 is configured to have stripe-like shapes including a plurality of lines extending in the second direction SD, and the island patterns 132 are disposed in a plurality of rows matching the lines of the link pattern 131. Thus, even though the island patterns 132 are bonded in a state in which they are shifted in the second direction SD from the predetermined positions, the overall area of the oxide-to-oxide bonding does not decrease.

Although the embodiments described above with reference to the drawings in the present specification illustrate a plurality of lines configuring the link pattern 131 extending in the second direction SD, the present disclosure is not limited thereto. For example, by observing the structure of a previously manufactured semiconductor device, a pad shift direction can be predicted for a semiconductor device to be that will be subsequently manufactured, and so the lines of the link pattern 131 may be configured to have a shape extending in the same direction as the predicted pad shift direction.

Although the embodiments described above with reference to the drawings in the present specification illustrate a first semiconductor chip as a memory chip including a memory cell array and a second semiconductor chip as a peripheral chip including a peripheral circuit for controlling the operation of the memory cell array, the types of the first and second semiconductor chips are not limited thereto.

Figure 15:
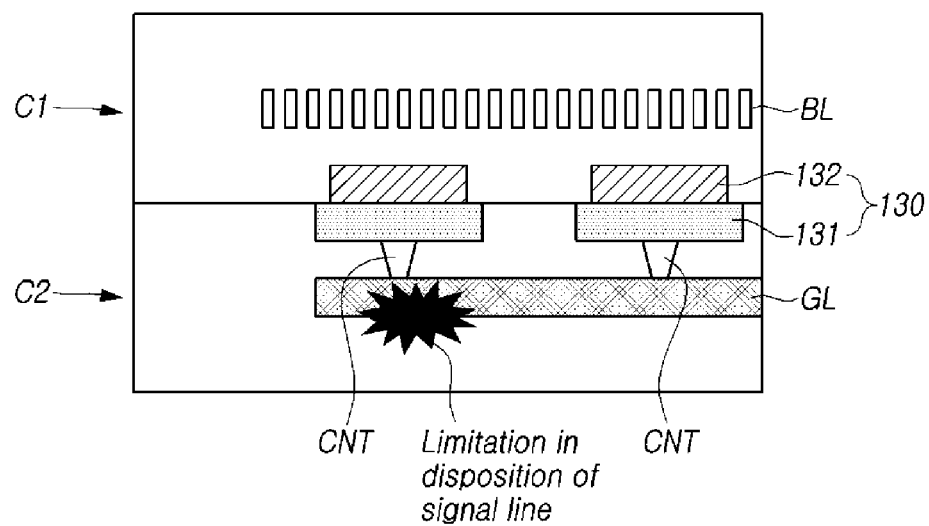
FIG. 15 is a cross-sectional view schematically illustrating a semiconductor device different from devices of the present disclosure.

FIG. 15 is a cross-sectional view schematically illustrating a semiconductor device different from devices of the present disclosure.

Referring to FIG. 15, a link pattern is divided into link patterns 131 whose number is the same as the number of island patterns 132, and the divided link patterns 131 are bonded to the island patterns 132, respectively. In this case, in order to apply a ground voltage, a ground line GL must overlap all of the island patterns 132 in the vertical direction VD. Thus, as the area occupied by the ground line GL increases, and the use efficiency of a metal layer in the semiconductor chips deteriorates.

In contract, referring back to FIGS. 2 to 14, according to the embodiments of the present disclosure, the link pattern 131 is configured in a grid shape or stripe shapes, and at least two island patterns 132 are coupled to each other through the link pattern 131. Thus, it is not necessary to configure the ground line GL to overlap each of the island patterns 132. That is to say, at least one of the plurality of island patterns 132 does not overlap with the ground line GL in the vertical direction VD. Accordingly, by reducing the area of the ground line GL, it is possible to increase the use efficiency of a metal layer.

As is apparent from the above description, according to embodiments of the present disclosure, it is possible to prevent the percentage of oxide-to-oxide bonding from excessively decreasing to an extent that causes deterioration in the bonding reliability between semiconductor chips. By using a shielding member, the interference between bit lines and signal lines may be prevented and at the same time, the bonding reliability between the semiconductor chips may be secured.

Figure 16:
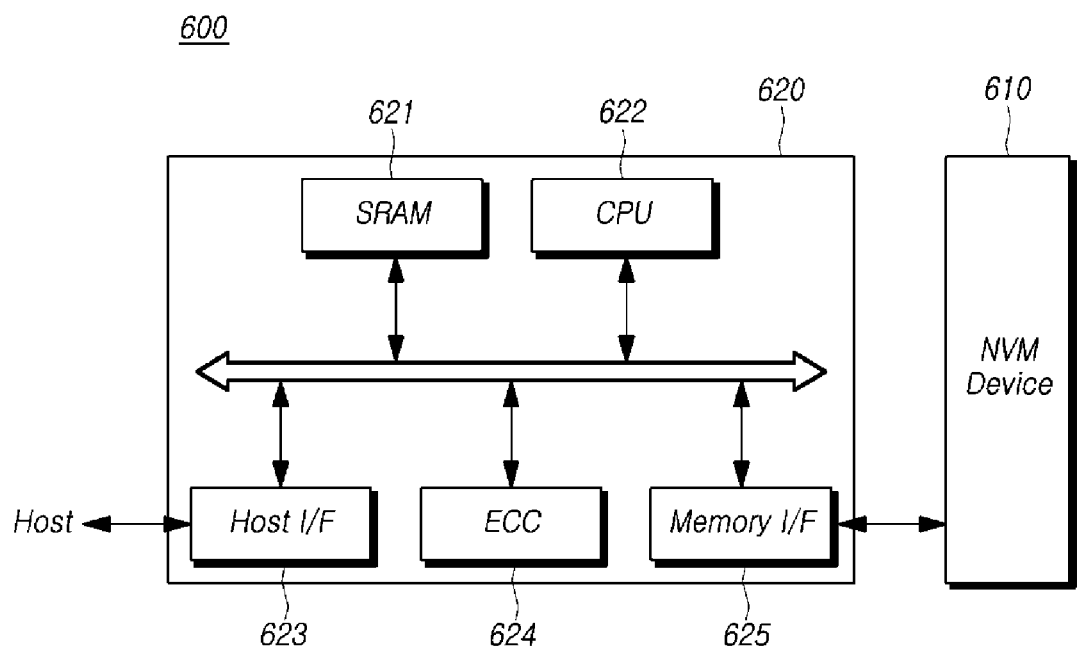
FIG. 16 is a block diagram schematically illustrating a memory system including a semiconductor device in accordance with an embodiment of the present disclosure.

FIG. 16 is a block diagram schematically illustrating a memory system including a semiconductor device in accordance with an embodiment of the present disclosure.

Referring to FIG. 16, a memory system 600 in accordance with an embodiment may include a nonvolatile memory device 610 and a memory controller 620.

The nonvolatile memory device 610 may be constituted by the semiconductor device described above and may operate in the manner described above. The memory controller 620 may be configured to control the nonvolatile memory device 610. By the combination of the nonvolatile memory device 610 and the memory controller 620, a memory card or a solid state disk (SSD) may be provided. An SRAM 621 is used as a working memory of a processing unit 622. The processing unit 622 performs general control operations for data exchange of the memory controller 620.

A host interface 623 includes a data exchange protocol of a host, which is coupled with the memory system 600. An error correction code block 624 detects and corrects an error included in data read from the nonvolatile memory device 610. A memory interface 625 interfaces with the nonvolatile memory device 610 of the present embodiment.

Although not shown in the drawing, it is obvious to a person of ordinary skill in the art to which the embodiment pertains that the memory system 600 in accordance with the embodiment may be additionally provided with a ROM that stores code data for interfacing with the host. The nonvolatile memory device 610 may be provided as a multi-chip package, which is constituted by a plurality of flash memory chips.

The memory system 600 in accordance with embodiments described above, may be provided as a storage medium of high reliability, which has a low probability of an error to occur. In particular, the nonvolatile memory device of the present embodiment may be included in a memory system such as a solid state disk (SSD), which is being actively studied recently. In some examples, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 17:
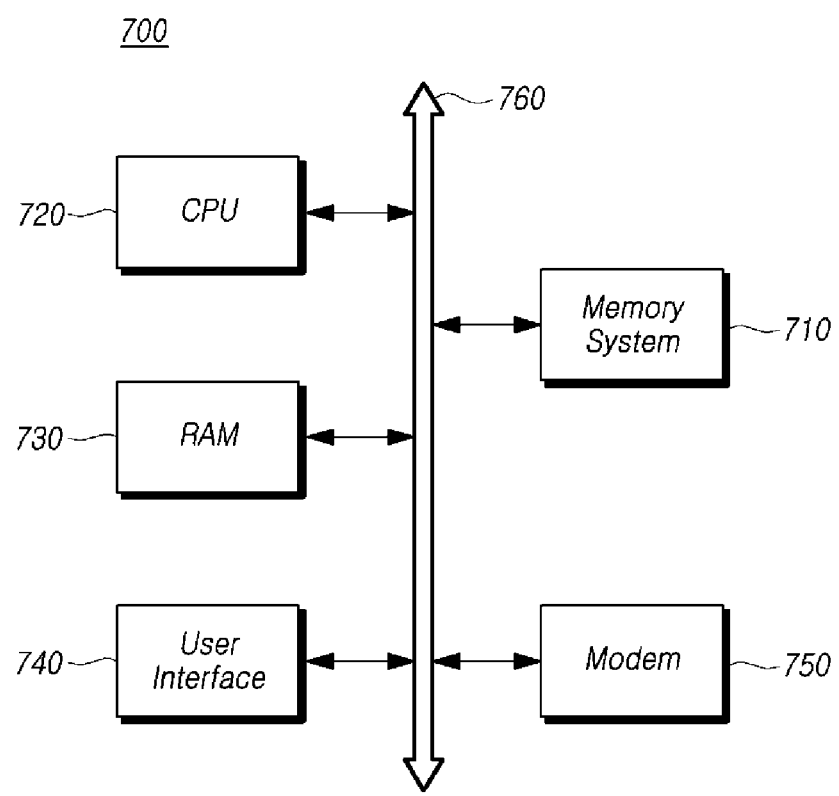
FIG. 17 is a block diagram schematically illustrating a computing system including a semiconductor device in accordance with an embodiment of the present disclosure.

FIG. 17 is a block diagram schematically illustrating a computing system including a semiconductor device in accordance with an embodiment of the present disclosure.

Referring to FIG. 17, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor device comprising:
a first semiconductor chip including a memory cell array and a plurality of bit lines;
a second semiconductor chip, including a peripheral circuit and bonded to the first semiconductor chip; and
a shielding member including a link pattern disposed in a bonding metal layer of one of the first semiconductor chip and the second semiconductor chip, and has a grid shape or stripe shapes, and a plurality of island patterns disposed in a bonding metal layer of the other one of the first semiconductor chip and the second semiconductor chip, and bonded to the link pattern,
wherein the plurality of island patterns are disposed in a plurality of rows that are arranged in a direction in which the plurality of bit lines extend.

2. The semiconductor device according to claim 1, wherein a ground voltage is applied to the shielding member.

3. The semiconductor device according to claim 1, further comprising:
a ground line disposed in an inner metal layer between the bonding metal layer and the peripheral circuit of the second semiconductor chip and coupled to the shielding member.

4. The semiconductor device according to claim 3, wherein the ground line does not overlap at least one of the plurality of island patterns in a vertical direction perpendicular to the bonding metal layer.

5. The semiconductor device according to claim 1, wherein at least two of the plurality of island patterns are electrically coupled through the link pattern.

6. The semiconductor device according to claim 1, wherein
the plurality of island patterns in an odd-numbered row and the plurality of island patterns in an even-numbered row are offset from each other in a row direction and the plurality of island patterns of the odd-numbered row and the plurality of island patterns of the even-numbered row do not overlap the same bit lines.

7. The semiconductor device according to claim 1, wherein the link pattern of the grid shape is configured as a plurality of first lines extending in a direction in which the plurality of bit lines extend and a plurality of second lines extending in a direction in which the plurality of bit lines are arranged.

8. The semiconductor device according to claim 7, wherein a plurality of intersections where the plurality of first lines and the plurality of second lines intersect in the link pattern vertically overlap the plurality of island patterns, respectively.

9. The semiconductor device according to claim 1, wherein stripes of the link pattern of the stripe shapes extend in a direction in which the plurality of bit lines are arranged.

10. A semiconductor device comprising:
a first semiconductor chip;
a second semiconductor chip bonded to the first semiconductor chip; and
a shielding member including a link pattern configured in a bonding metal layer of one of the first semiconductor chip and the second semiconductor chip, and has a grid shape or stripe shapes, and a plurality of island patterns configured in a bonding metal layer of the other one of the first semiconductor chip and the second semiconductor chip, and bonded to the link pattern,
wherein the plurality of island patterns are disposed in a plurality of rows that are arranged in a direction in which a plurality of bit lines extend.

11. The semiconductor device according to claim 10, wherein a ground voltage is applied to the shielding member.

12. The semiconductor device according to claim 10, further comprising:
a ground line configured in an inner metal layer of the second semiconductor chip and coupled to the shielding member.

13. The semiconductor device according to claim 10, wherein one of the plurality of island patterns is electrically coupled to another island pattern through the link pattern.

14. The semiconductor device according to claim 10, wherein the link pattern has the grid shape and is configured such that intersections where lines configuring the link pattern intersect with each other match the plurality of island patterns, respectively.

* * * * *